(12) United States Patent
Paek et al.

(10) Patent No.: US 10,515,825 B2
(45) Date of Patent: Dec. 24, 2019

(54) SEMICONDUCTOR DEVICE AND MANUFACTURING METHOD THEREOF

(71) Applicant: Amkor Technology, Inc., Tempe, AZ (US)

(72) Inventors: Jong Sik Paek, Incheon (KR); Doo Hyun Park, Anyang-si (KR); Seong Hyun Seo, Seoul (KR); Sung Geun Kang, Bucheon-si (KR); Yong Song, Seoul (KR); Wang Gu Lee, Goyang-si (KR); Eun Young Lee, Gumi-si (KR); Seo Yeon Ahn, Kwangju-si (KR); Pil Je Sung, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 16/134,590

(22) Filed: Sep. 18, 2018

(65) Prior Publication Data

US 2019/0067035 A1 Feb. 28, 2019

Related U.S. Application Data

(63) Continuation of application No. 14/977,977, filed on Dec. 22, 2015, now Pat. No. 10,079,157.

(30) Foreign Application Priority Data

Dec. 30, 2014 (KR) .................. 10-2014-0193744

(51) Int. Cl.
*H01L 21/48* (2006.01)
*H01L 23/14* (2006.01)
(Continued)

(52) U.S. Cl.
CPC ...... *H01L 21/4853* (2013.01); *H01L 21/4857* (2013.01); *H01L 23/145* (2013.01);
(Continued)

(58) Field of Classification Search
CPC ........... H01L 23/15; H01L 2924/18161; H01L 24/13; H01L 24/16; H01L 24/81; H01L 2021/60022; H01L 23/3128
See application file for complete search history.

(56) References Cited

U.S. PATENT DOCUMENTS

2008/0258300 A1 10/2008 Kobayashi
2009/0242245 A1 10/2009 Asano
(Continued)

FOREIGN PATENT DOCUMENTS

JP 2009-260335 11/2009
KR 10-2013-0118757 10/2013
(Continued)

OTHER PUBLICATIONS

Search Report corresponding to Taiwan Patent Application No. 104143763, completed Nov. 29, 2016.

*Primary Examiner* — Jay C Chang
*Assistant Examiner* — Mikka Liu
(74) *Attorney, Agent, or Firm* — McAndews, Held & Malloy, Ltd.

(57) ABSTRACT

A method for manufacturing a semiconductor device and a semiconductor device produced thereby. For example and without limitation, various aspects of this disclosure provide methods for manufacturing a semiconductor device, and semiconductor devices produced thereby, that comprise forming an interposer including a reinforcement layer.

20 Claims, 7 Drawing Sheets

(51) Int. Cl.
*H01L 23/498* (2006.01)
*H01L 21/60* (2006.01)
*H01L 23/31* (2006.01)
*H01L 23/00* (2006.01)
*H01L 23/15* (2006.01)

(52) U.S. Cl.
CPC .. *H01L 23/49816* (2013.01); *H01L 23/49822* (2013.01); *H01L 23/49894* (2013.01); *H01L 23/147* (2013.01); *H01L 23/15* (2013.01); *H01L 23/3128* (2013.01); *H01L 23/49827* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2021/60022* (2013.01); *H01L 2224/0401* (2013.01); *H01L 2224/131* (2013.01); *H01L 2224/13082* (2013.01); *H01L 2224/13147* (2013.01); *H01L 2224/16227* (2013.01); *H01L 2224/32225* (2013.01); *H01L 2224/73204* (2013.01); *H01L 2224/81203* (2013.01); *H01L 2224/81815* (2013.01); *H01L 2224/83192* (2013.01); *H01L 2224/92125* (2013.01); *H01L 2924/1432* (2013.01); *H01L 2924/1434* (2013.01); *H01L 2924/15311* (2013.01); *H01L 2924/18161* (2013.01); *H01L 2924/19105* (2013.01)

(56) References Cited

U.S. PATENT DOCUMENTS

| | | | |
|---|---|---|---|
| 2013/0277829 | A1 | 10/2013 | Yee et al. |
| 2014/0070423 | A1 | 3/2014 | Woychik et al. |
| 2014/0225258 | A1* | 8/2014 | Chiu ............... H01L 23/49816 257/738 |
| 2014/0252646 | A1 | 9/2014 | Hung et al. |
| 2015/0200179 | A1 | 7/2015 | Do et al. |

FOREIGN PATENT DOCUMENTS

| | | |
|---|---|---|
| KR | 10-2014-0060435 | 5/2014 |
| KR | 10-2014-0068624 | 6/2014 |
| TW | 200950012 | 12/2009 |
| TW | 201417221 | 5/2014 |
| TW | 201430967 | 8/2014 |

\* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a continuation of U.S. application Ser. No. 14/977,977, filed on Dec. 22, 2015, which is issuing as U.S. Pat. No. 10,079,157, which makes reference to, claims priority to, and claims the benefit of Korean Patent Application No. 10-2014-0193744, filed on Dec. 30, 2014, in the Korean Intellectual Property Office and titled "SEMICONDUCTOR DEVICE AND MANUFACTURING METHOD THEREOF," the contents of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present methods for forming various semiconductor devices, for example including an interposer, are inadequate, for example unnecessarily expensive and/or resulting in a semiconductor device that is susceptible to failure due to a mismatch in the thermal coefficients of expansion of various parts. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
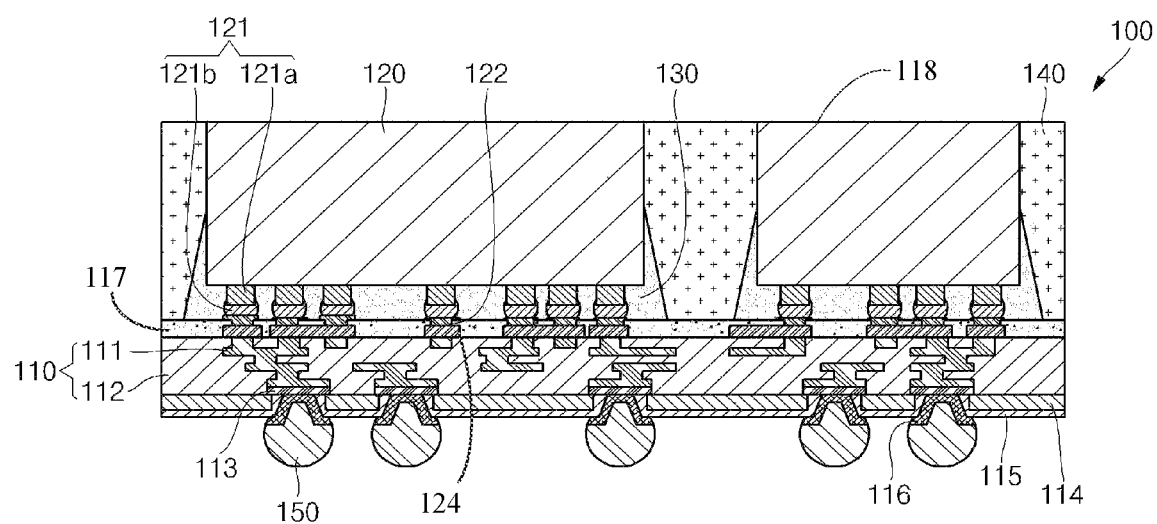
FIG. 1 shows a cross-sectional view of a semiconductor device, in accordance with various aspects of the present disclosure.

Various aspects of this disclosure provide a method for manufacturing a semiconductor device and a semiconductor device produced thereby. For example and without limitation, various aspects of this disclosure provide a method for manufacturing a semiconductor device, and a semiconductor device produced thereby, that comprises forming an interposer including a reinforcement layer.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

In the drawings, various dimensions (e.g., layer thickness, width, etc.) may be exaggerated for illustrative clarity. Additionally, like reference numbers are utilized to refer to like elements throughout the discussions of various examples.

Various aspects of the present disclosure provide a method for manufacturing a semiconductor device and a semiconductor device produced thereby. For example and without limitation, various aspects of this disclosure provide a method for manufacturing a semiconductor device, and a semiconductor device produced thereby, that comprises forming an interposer including a reinforcement layer.

According to various aspects of the present disclosure, there is provided a semiconductor device comprising an interposer that comprises one or more conductive layers and one or more dielectric layers, a semiconductor die connected to a conductive layer of the interposer and facing a top side of the interposer, an encapsulant encapsulating the semiconductor die, and an interconnection structure connected to a conductive layer of the interposer and facing a bottom side of the interposer, wherein the bottom side of the interposer comprises a reinforcement layer formed on the bottom side of the interposer except for a region thereof that is connected to the interconnection structure.

The reinforcement layer may, for example, be made of silicon (Si). The reinforcement layer may, for example, comprise a thickness in a range of 10 μm to 30 μm. Also for example, the reinforcement layer may comprise a remaining portion of a thinned substrate on which various layers the interposer were formed. Further for example, the semiconductor device may comprise a passivation layer between the reinforcement layer and the interconnection structure. Still further for example, the semiconductor device may comprise an under bump metal structure comprising at least one metal layer between the reinforcement layer and the interconnection structure.

According to various aspects of the present disclosure, there is provided a method of manufacturing a semiconductor device, the manufacturing method comprising forming an interposer that comprises one or more conductive layers and one or more dielectric layers on a substrate, forming a reinforcement layer of the interposer by removing a first portion of the substrate and allowing a second portion of the substrate to remain, coupling a semiconductor die to a conductive layer of the interposer and facing a top side of the interposer, encapsulating the semiconductor die using an encapsulant, and coupling an interconnection structure to a conductive layer of the interposer and facing a bottom side of the interposer.

For example, removing the first portion of the substrate may be performed by grinding the substrate. Also for example, the reinforcement layer may be formed to a thickness in a range of 10 μm to 30 μm. The interposer may, for example, have a multi-layered structure formed by forming a seed layer on the substrate, patterning the seed layer, forming a conductive layer on the patterned seed layer, forming a dielectric layer on the conductive layer, forming an aperture in the dielectric layer and filling the aperture with conductive material, and repeating any or all of such operations as desired. A region of the patterned seed layer may, for example, be exposed after the removing of the first portion of substrate to form a land. The manufacturing method may further, for example, comprise forming a passivation layer formed between the reinforcement layer and the interconnection structure. Also for example, the manufacturing method may comprising forming an under bump metal that comprises a structure of at least one layer between the reinforcement layer and the interconnection structure.

As described herein, in the semiconductor device and the manufacturing method thereof according to various aspects of the present disclosure, during the grinding of the first portion of the substrate upon which the interposer is formed, a second portion of the substrate is allowed to remain, thereby forming a reinforcement layer at a surface of the interposer. The reinforcement layer provides rigidity to the interposer, and thus provides protection for the semiconductor device due to different respective coefficients of thermal expansion (CTE) of the various semiconductor device components.

The discussion will now refer to various example illustrations provided to enhance the understanding of various aspects of the present disclosure. It should be understood that the scope of this disclosure is not limited by the specific characteristics of the examples provided and discussed herein.

FIG. 1 shows a cross-sectional view of a semiconductor device, in accordance with various aspects of the present disclosure.

Referring to FIG. 1, the example semiconductor device 100 comprises an interposer 110, a semiconductor die 120, an underfill 130, an encapsulant 140 and an interconnection structure 150.

The interposer 110 may, for example, comprise a plurality of conductive layers 111, a plurality of dielectric layers 112, a land 113, a reinforcement layer 114, a dielectric layer 115, and an under bump metal 116. In an example implementation, the interposer 110 may comprise one or more conductive layers 111 (which may also be referred to herein as redistribution layers), and one or more dielectric layers 112. In an example implementation, a first (or top) conductive layer is exposed from (e.g., in or through an opening, etc.) a first (or top) dielectric layer at a top side of the interposer 110, and a second (or bottom) conductive layer is exposed from (e.g., in or through an opening in, etc.) a second (or bottom) dielectric layer at a bottom side of the interposer 110.

In an example implementation, the lower conductive layer exposed at the bottom side of the interposer 110 (e.g., to which conductive interconnection structures 150 are coupled) may be wider, thicker, and/or comprise a greater pitch (or center-to-center spacing) relative to the upper conductive layer exposed at the top side of the interposer 110 (e.g., to which a semiconductor die 120 is coupled). For example, a land 113 at the lower conductive layer, to which the conductive interconnection structure 150 is coupled, may have larger dimensions than conductive pads 124 (e.g., bonding pads, etc.) at the upper conductive layer, to which the semiconductor die 120 is coupled.

The conductive layer(s) 111 may comprise any of a variety of conductive materials, including but not limited to: copper, aluminum, tungsten, gold, alloys thereof, combinations thereof, equivalents thereof, other metals, other conductive material, etc. As discussed herein, the conductive layer(s) 111 may be formed in any of a variety of manners (e.g., sputtering, electroplating, electroless plating, etc.).

The dielectric layer(s) 112 may comprise any of a variety of dielectric materials, including but not limited to inorganic materials (e.g., silicon oxide, silicon nitride, oxides, nitrides, etc.) and/or organic materials (e.g., polymers, polyimide (PI), benzocyclobutene (BCB), polybenzoxazole (PBO), bismaleimidetriazine (BT), phenolic resin, mold material, epoxy, combinations thereof, equivalents thereof, etc.). In various example implementations, for example when a dielectric layer 112 is made of silicon oxide or silicon nitride, a conductive layer 111 formed thereon may be formed to have a relatively fine pitch (e.g., center-to-center spacing) of a sub-micron level, sub-two-micron level, etc. Additionally, in various example implementations, for example when a dielectric layer 112 is made of an organic dielectric material, a conductive layer 111 formed thereon may be formed to have a relatively coarse pitch of two-to-five microns, greater than five microns, etc. The dielectric layer(s) 112 may be formed in any of a variety of manners (e.g., chemical vapor deposition, printing, ink jet printing, etc.).

Additionally, in various example implementations, a passive element (e.g., a resistor, capacitor, inductor, etc.) may also be embedded in and/or between portions of the conductive layer(s) 111 of the interposer 110.

In an example implementation in which one or more of the dielectric layers 112 is formed of an inorganic dielectric material (e.g., silicon oxide, silicon nitride, etc.), the forming and/or patterning of the conductive layer(s) 111 and/or the dielectric layer(s) 112 may be performed utilizing semiconductor fabrication processes (e.g., back end of line (BEOL) processes, wafer fab processes, etc.). Additionally, in various example implementations in which the interposer 110 is not formed with through silicon vias (TSVs), the interposer 110 may be formed with a reduced thickness and at a reduced cost.

The example semiconductor device 100 may, for example, comprise one or more lands 113. The land 113 may, for example, be exposed through an aperture in the reinforcement layer 114 (discussed herein). As discussed herein, the lower conductive layer 111 may be formed on a seed layer. In such an example scenario, the land 113 may comprise a portion of such seed layer exposed through an aperture in the reinforcement layer 114 and/or in the dielectric (or pas sivation) layer 115.

In an example implementation, the land 113 and/or the conductive layer 111 to which the land 113 is coupled may comprise relatively large dimensions, for example to accommodate connection to a relatively large interconnection structure 150 (e.g., a conductive ball, conductive bump, etc.). In an example implementation in which the interconnection structure 150 comprises a conductive bump (or ball) or other structure, under bump metal 116 may be formed on the land 113 to increase the coupling force between the conductive bump and the land 113.

The example semiconductor device 100 may, for example, comprise a reinforcement layer 114 at the bottom of the interposer 110 (e.g., directly or indirectly coupled thereto). For example, the reinforcement layer 114 may be coupled to a lower dielectric layer 112 of the interposer 110 (e.g., a dielectric layer 112 at the bottom side of the interposer 110). Note that the lower dielectric layer 112 to which the reinforcement layer 114 is coupled may have been formed on the reinforcement layer 114 (e.g., prior to thinning a substrate to form the reinforcement layer 114).

The reinforcement layer 114 may, for example, cover edges of the land 113, which as discussed herein may be exposed from the reinforcement layer 114 (e.g., through an aperture formed in the reinforcement layer). The reinforcement layer 114 may, for example, be formed by allowing a portion of the substrate 10, on which the interposer 110 was formed, to remain after thinning the substrate 10. For example, in an example implementation, the reinforcement layer 114 may be formed by allowing a predetermined thickness of the substrate (e.g., made of silicon, made of mold material (e.g., preformed, printed, ink-jetted, etc.), etc.) to remain after thinning (e.g., mechanically grinding, etching, etc.) the substrate. The reinforcement layer 114 may, for example, have a thickness in a range of 10 μm to 30 μm. The reinforcement layer 114 may also, for example, have a thickness less than 10 μm.

The example semiconductor device 100 may, for example, comprise underfill 130 between the interposer 110 and the semiconductor die 120. Imperfections in the underfill and/or CTE mismatch between various components of the semiconductor device 100 may result in damage to the semiconductor device 100 during production and/or during use. For example, mechanical stresses may result in failed connections and/or warpage. In a semiconductor device 100 according to various aspects of the present disclosure, since the reinforcement layer 114 is provided on a surface of the interposer 110, the rigidity of the interposer 110 is substantially increased, thereby reducing the probability of and/or extent of damage caused to the semiconductor device 100.

As mentioned herein, the reinforcement layer 114 may comprise an aperture (or opening, or via) formed at a region corresponding to the land 113 to expose the land 113 (or a portion thereof) from the reinforcement layer 114. In an example implementation, the aperture may have a width:height ratio of 1.0:0.3 or greater. In another example implementation, the aperture may have a width:height ratio of about 0.3:1.0. As discussed herein, the aperture may be formed in any of a variety of manners (e.g., laser or mechanical ablation, chemical etching, etc.).

The example semiconductor device 100 may, for example, comprise a dielectric layer 115 that covers the reinforcement layer 114. Such a dielectric layer 115 may also be referred to as a passivation layer. The dielectric layer 115 may, for example, cover a primary surface of the reinforcement layer 114, for example a surface opposite the dielectric layer 112, and may also cover a surface of the reinforcement layer 114 inside of the aperture(s) through which the land(s) 113 are exposed (e.g., walls of the aperture (s)). The dielectric layer 115 may, for example, comprise an aperture (or opening) through which the land 113 is exposed. For example, the land(s) 113 may be exposed through apertures in both the reinforcement layer 114 and the dielectric layer 115. The dielectric layer 115 may comprise any of a variety of dielectric materials, for example any or all of the materials discussed herein with regard to the dielectric layer(s) 112 (e.g., organic dielectric materials, inorganic dielectric materials, etc.). The dielectric layer 115 may, for example, be formed in any of a variety of manners, for example any or all of the manners in which the dielectric layer(s) 112 is formed (e.g., vapor deposition, etc.).

The example semiconductor device 100 may, for example, comprise under bump metal (UBM) 116 on the land 113 exposed through the reinforcement layer 114. The UBM 116 may, for example, be positioned between the land 113 and the interconnection structure 150 (e.g., a conductive bump or ball, etc.). Though the UBM 116 illustrated in FIG. 1 is shown as a single layer, as illustrated elsewhere herein (e.g., at FIG. 3I), the UBM 116 may comprise multiple layers. For example, the UBM 116 may comprise one or more of: chrome/chrome-copper alloy/copper (Cr/Cr—Cu/ Cu), titanium-tungsten alloy/copper (Ti—W/Cu), aluminum/nickel/copper (Al/Ni/Cu), alloys thereof, combinations thereof, equivalents thereof, etc., but the scope of the present disclosure is not limited thereto.

The example semiconductor device 100 may, for example, comprise a semiconductor die 120. The semiconductor die 120 may comprise any of a variety of characteristics. For example, the semiconductor die 120 may comprise a memory device, a graphics processing unit (GPU), central processing unit (CPU), a general purpose processor, a microcontroller, a math coprocessor, a multichip module, a plurality of semiconductor devices, etc., but the scope of the present disclosure is not limited thereto. Though various aspects of this disclosure are presented in the context of a semiconductor die attachment, the scope of this disclosure is not limited to semiconductor circuitry. For example, instead of or in addition to the semiconductor die 120, one or more passive electrical components may be coupled to the interposer 110. As shown at item 118, the example semiconductor device 100 may comprise one or more additional semiconductor dies (e.g., attached in a same manner as the semiconductor die 120 or differently).

The example semiconductor die 120 comprises a connection terminal 121 that is electrically connected to the interposer 110 (e.g., to a connection pad 124 at the top side thereof). As illustrated in FIG. 1, the connection terminal 121 may comprise a copper pillar 121*a* and a solder cap 121*b* at its end. The connection terminal 121 may, for example, comprise characteristics of any of a variety of types of connection terminals (e.g., conductive balls or bumps, solder balls or bumps, conductive pillars or posts, conductive wires, etc.). In addition to and/or instead of the solder cap 121*b*, solder 122 for facilitating a connection between the connection terminal 121 and a respective connection pad 124 of the interposer 110 may be pre-formed (e.g., formed prior to attachment of the die 120). For example, the solder 122 may be plated or printed on the connection pad 124, for example on a top surface of the interposer 110 (e.g., on a top conductive layer 111 of the interposer 110 exposed through an aperture in an upper dielectric layer 112 of the interposer).

The example semiconductor device 100 may, for example, comprise an underfill 130 between the interposer 110 and the semiconductor die 120. For example, the underfill 130 may cover a portion of the interposer 110 (e.g., a top surface thereof), a side portion of the semiconductor die 120, fill a gap between the interposer 110 and the semiconductor die 120, and/or surround interconnection structures (e.g., the connection terminals 121, solder 122, pads 124, etc.) of the semiconductor device 100. The underfill 130 may, for example, enhance physical/mechanical coupling forces between the interposer 110 and the semiconductor die 120 and may inhibit or prevent the interposer 110 and the semiconductor die 120 from being separated from each other due to stress caused by a CTE difference between the interposer 110 and the semiconductor die 120.

The example semiconductor device 100 may also comprise an encapsulant 140 that encapsulates the semiconductor die 120 on the interposer 110, thereby protecting the semiconductor die 120 from external environments. For example, the example encapsulant 140 encapsulates surfaces of the semiconductor die 120 and the underfill 130. The encapsulant 140 may, for example, cover a portion of the top surface of the interposer 110, cover side surfaces of the underfill 130, cover side surfaces and/or side surface portions of the semiconductor die 120, etc. However, as shown in FIG. 1, a top surface of the semiconductor die 120 may be exposed to the outside from the encapsulant 140, thereby improving heat dissipating performance of the semiconductor die 120, or the encapsulant 140 may cover the top surface of the semiconductor die 120.

In an example implementation, side surfaces of the encapsulant 140 are coplanar with those of the interposer 110 (e.g., dielectric layer(s) 112 thereof, the reinforcement layer 114, etc.), with those of the dielectric layer 115, etc. Also a top surface of the encapsulant 140 may be coplanar with that of the semiconductor die 120, thereby implementing a compact structure of the semiconductor device 100 according to various aspects of the present disclosure. Note that in an example implementation, the encapsulant 140 may cover a top surface of the semiconductor die 120.

The conductive interconnection structure 150 is connected to a lower conductive layer 111 of the interposer 110 at a bottom portion of the interposer 110. For example, under bump metal 116 (e.g., comprising one or more metal layers) on the land 113, or a portion thereof, may be exposed from the reinforcement layer 114 (e.g., formed in an aperture of the reinforcement layer 114 and/or on the lower surface of the reinforcement layer 114 and formed in an aperture of the dielectric layer 115), and the interconnection structure 150 is connected to the under bump metal 116. In an example implementation, the interconnection structure 150 may comprise a conductive bump, which may for example, be smaller than a conductive ball (e.g., a solder ball, etc.). In such an example implementation, the interconnection structure 150 may also be referred to as a micro bump. The bump 150 may, for example, comprise a diameter of about 100 μm or less. A solder ball may, for example, comprise a diameter in a range of about 200 to 400 μm.

The semiconductor die 120 may, for example, be mounted to the interposer 110 in a flip-chip configuration (e.g., active side facing the interposer 110). The semiconductor device 100, for example, may be a stand-alone device or package (e.g., a chip scale package, etc.), may be mounted to a packaging substrate of a semiconductor package, may be mounted to a motherboard of an electrical circuit, etc.

As described herein, in the semiconductor device 100 according to various aspects of the present disclosure, rigidity of the interposer 110 may be enhanced or increased by having the reinforcement layer 114 on a surface of the interposer 110, such that a portion of a substrate used in fabricating the interposer 110 is allowed to remain after thinning. Accordingly, damage to the semiconductor device 100, for example due to underfill imperfections, CTE mismatch, etc., may be prevented or reduced.

Figure 2:
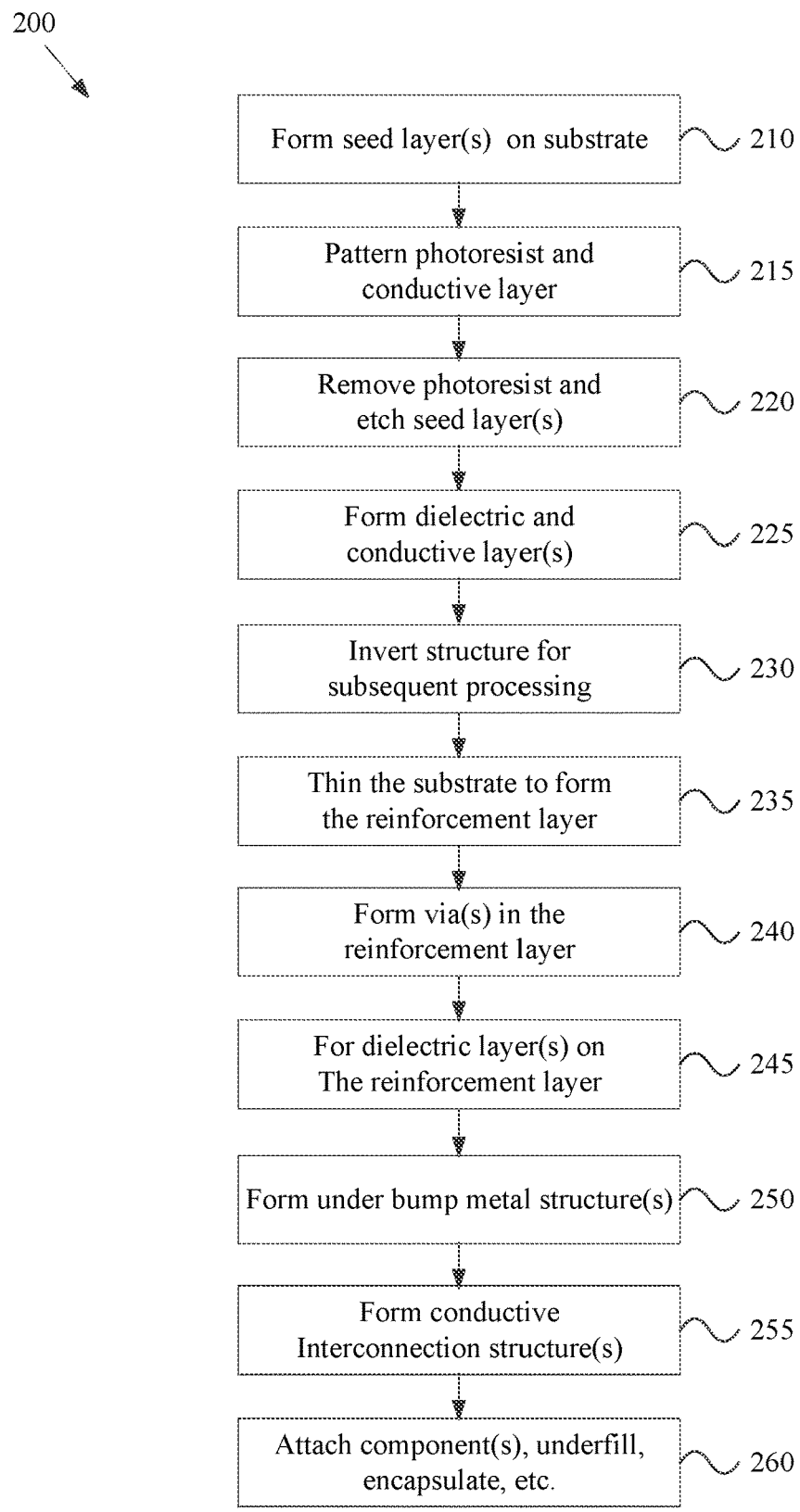
FIG. 2 shows a flow diagram of an example method of manufacturing a semiconductor device, in accordance with various aspects of the present disclosure.

Herein, an example method of manufacturing a semiconductor device, in accordance with various aspects of the present disclosure, is described. FIG. 2 shows a flow diagram of an example method 200 of manufacturing a semiconductor device, in accordance with various aspects of the present disclosure. Additionally, FIGS. 3A-3K show cross-sectional views illustrating various aspects of the example method shown in FIG. 2. The example method 200 may, for example, result in formation of the example semiconductor device 100 of FIG. 1, the example semiconductor device 300 of FIG. 3K, etc.

For illustrative convenience, FIGS. 3A to 3D may be grouped as front surface production processes of the semiconductor device 100 shown in FIG. 1, and FIGS. 3E-3K may be grouped as back surface production processes. Such grouping is, however, is for illustrative convenience and non-limiting.

The example method 200 may begin executing in response to any of a variety of causes or conditions, non-limiting examples of which are provided herein. For example, the example method 200 may begin executing in response to components arriving at a production work station, in response to a user input, in response to an automation controller communicating a signal to begin, etc.

Figure 3A:
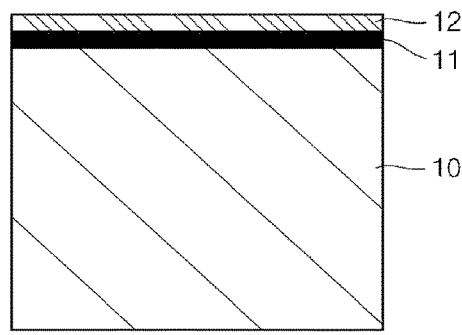
FIGS. 3A-3K show cross-sectional views illustrating various aspects of the example method shown in FIG. 2.

At block 210, the example method 200 may comprise forming one or more seed layers on a substrate. FIG. 3A provides an illustration of an example structure resulting from the execution of block 210. The substrate 10 may, for example, comprise any of a variety of substrates (e.g., a silicon substrate, a semiconductor substrate, a ceramic substrate, a glass substrate, etc.). For example, the substrate 10 may comprise a silicon wafer, silicon panel, etc. In an example implementation, block 210 comprises forming a first seed layer 11 on the substrate 10, and forming a second seed layer 12 on the substrate 10. Though not shown in FIG. 3A, the substrate 10 may comprise a native dielectric layer (e.g., a native oxide or nitride) on the surface thereof.

In an example implementation, a first seed layer 11 may be formed on the substrate 10, and a second seed layer 12 may be formed on the first seed layer 11. In a first example implementation, the first seed layer 11 may comprise a titanium layer, and the second seed layer 12 may comprise a copper layer. In another example implementation, the first seed layer 11 may comprise a titanium (or titanium-tungsten layer), and the second seed layer 12 may comprise a copper layer. In another example implementation, only a single seed layer 11 of titanium-tungsten is formed. The seed layer(s) 11 and 12 may be formed in any of a variety of manners, non-limiting examples of which are discussed herein. For example, the seed layer(s) 11 and 12 may be formed by sputtering, spraying, printing, etc. The seed layer(s) 11 and 12 may, for example, be formed in a blanket manner (e.g., covering the entirety of the substrate 10) or may be formed in a patterned manner.

The one or more seed layers 11 and 12 may, for example, enhance, or enable plating a conductive layer 111 of the interposer 110 thereon. As will be shown here, for example after thinning the substrate 10 to create the reinforcement structure 114 and forming an aperture therein, a portion of the seed layer 11 may be exposed to form a land 113.

Figure 3B:
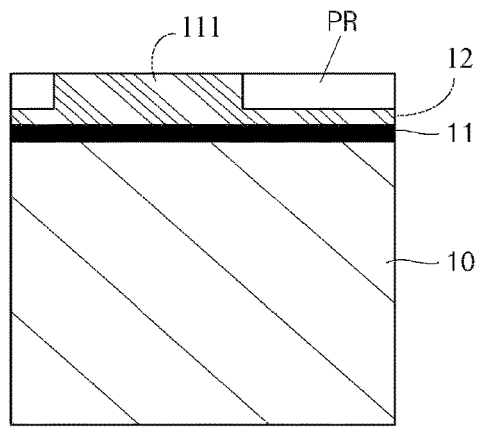

At block 215, the example method 200 may comprise patterning a photoresist (PR) layer on the second seed layer 12, for example utilizing a photo lithography process. FIG. 3B provides an illustration of an example structure resulting from execution of block 215. A conductive layer 111 (e.g., a first conductive layer of a plurality of conductive layers) may then be formed on the portions of the seed layer 12 exposed from the photoresist. For example, block 215 may comprise plating the conductive layer 111 on the seed layer 12. As discussed herein, the conductive layer 111 may comprise any of a variety of material and/or structural characteristics. For example, the conductive layer 111 may comprise copper, aluminum, tungsten, gold, alloys thereof, combinations thereof, equivalents thereof, other metals, other conductive material, etc. Block 215 may also, for example, comprise forming the conductive layer 111 in any of a variety of manners (e.g., electroplating, electroless plating, sputtering, printing, etc.).

Figure 3C:
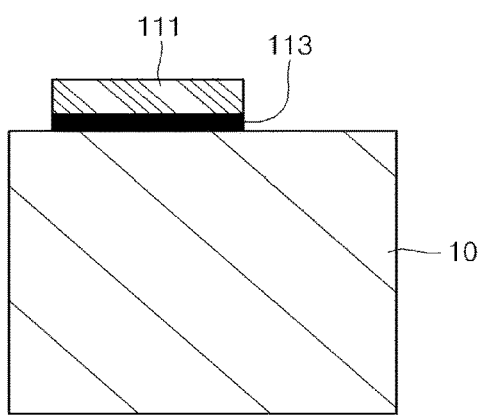

At block 220, the example method 200 may comprise removing a portion of the seed layer(s) 11 and 12 that is not covered by the conductive layer 111. FIG. 3C provides an illustration of an example structure resulting from execution of block 220. For example, after the conductive layer 111 is formed at block 215, the photoresist PR may be removed (e.g., chemically removed, etc.), thereby exposing a portion of the seed layer(s) 11 and 12 that is not covered by the conductive layer 111. Block 220 then, for example, comprises removing (e.g., by chemical etching, etc.) such exposed seed layer portion. As shown in FIG. 3C, the remaining (e.g., non-etched) portion of the seed layer(s) 11 and 12 underneath the conductive layer 111 will also be referred to herein as the land 113.

Figure 3D:
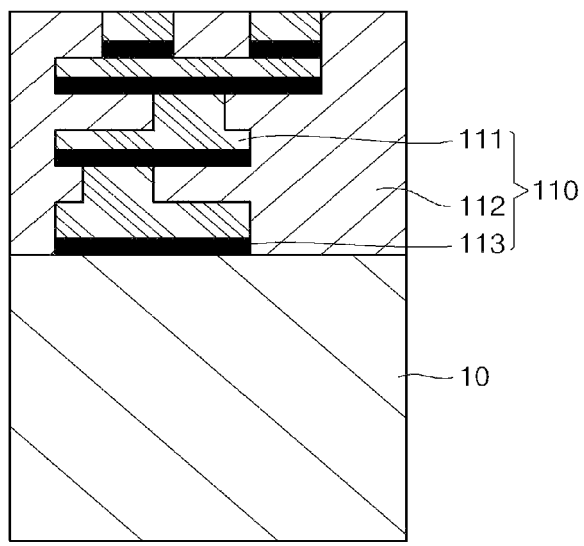

At block 225, the example method 200 may comprise forming a dielectric layer 112 on the conductive layer 111 formed at block 220 and on the substrate 110 that is exposed after etching away portions of the seed layer(s) 11 and 12. FIG. 3D provides an illustration of an example structure resulting from execution of block 225. The dielectric layer 112 may, for example, be formed such that an aperture formed through the dielectric layer 112 exposes the conductive layer 111 beneath the dielectric layer 112. Note that the aperture may be formed in the dielectric layer 112 as the dielectric layer 112 is originally formed or may be formed in the dielectric layer 112 after the dielectric layer 112 is formed (e.g., by laser or mechanical ablation, chemical etching, etc.). The aperture may then, for example, be filled (e.g., fully or partially filled) with conductive material and connected to additional conductive layers 111.

As illustrated in FIG. 3D, the forming of the conductive layer 111 and/or the forming of the dielectric layer 112 may be performed a plurality of times, for example to build a multilayer signal redistribution structure. Note that various conductive layers or features may be formed on respective seed layers (e.g., as discussed herein, for example with respect to FIGS. 3A-3C). Also note that the dielectric and/or conductive material may change between layers. For example, the interposer may comprise a plurality of dielectric layers 112, each comprising a different respective dielectric material. Also for example, one or more layers in addition to the layers shown in FIG. 3D are illustrated in the completed semiconductor device 100 of FIGS. 1 and 3K (e.g., at item 117). Such additional layers 117 may, for example, be formed utilizing the same materials and/or processes as discussed with regard to FIG. 3D and/or may be formed utilizing the same materials and/or processes as discussed with regard to FIGS. 3E-3J (e.g., with regard to layers 113, 114, 115, 116a, 116b, and/or 116c, or any combination thereof).

FIGS. 3E-3J illustrate a rear surface treatment process in a manufacturing method of the semiconductor device shown in FIG. 1.

Figure 3E:
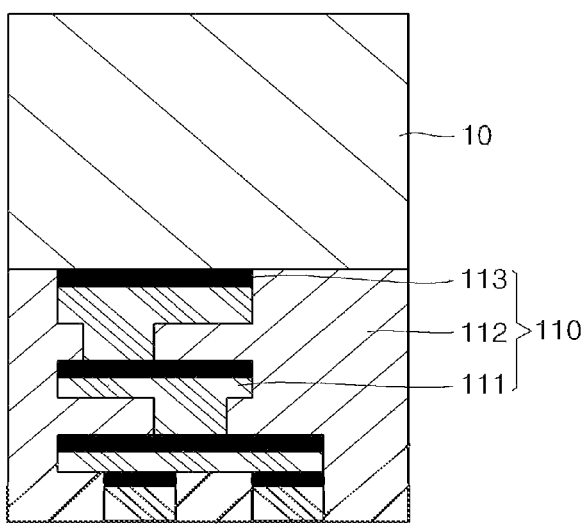

The example method 200 may, at block 230, comprise inverting the structure shown in FIG. 3D, depending on the orientation desired for subsequent processing. FIG. 3E provides an illustration of an example structure resulting from the execution of block 230. For example, at FIG. 3E the substrate 10 is located at the upper end of the structure, and the interposer 110 is located at the lower end of the structure. Though not shown in FIG. 3E, there may, for example, be a work piece holder attached at the lower end of the interposer 110 in FIG. 3E. The work piece holder may, for example, comprise any of a variety of characteristics (e.g., of a wafer support structure, a panel support structure, a single package support structure, a mechanical holder, a vacuum holder, an adhesive holder, etc.). Block 230 may, for example, be performed in preparation for block 235. Note that the inverting may be performed at or between any blocks or functions thereof discussed herein, or might not be performed depending on the manner in which the structure need be oriented for subsequent processes.

Figure 3F:
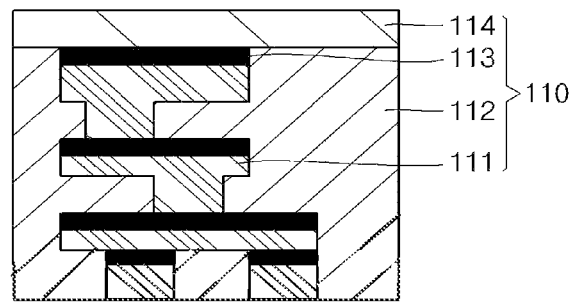

The example method 200 may, at block 235, comprise thinning the substrate 10. FIG. 3F provides an illustration of an example output structure resulting from execution of block 235. The substrate 10 may be thinned in any of a variety of manners (e.g., by mechanical grinding, by chemical etching, etc.). Block 235 may, for example, comprise thinning the substrate 10 from the top down in FIGS. 3E-3F in a direction toward the interposer 110. In an example implementation, the thinning of the substrate 10 is performed until a final thickness is achieved in the range 10 μm to 30 μm. In another example implementation, the thinning of the substrate may be performed until a final thickness of less than 10 μm is achieved. The remaining substrate 10 will be referred to herein as the reinforcement layer 114.

Figure 3G:
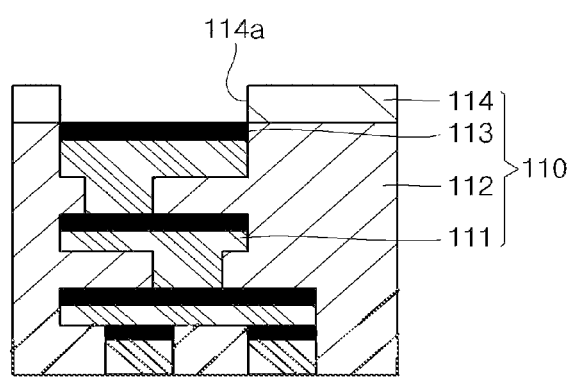

Block 240 of the example method 200 may, for example, comprise forming a via 114a through the reinforcement layer 114 (e.g., directly through the reinforcement layer, etc.). FIG. 3G provides an illustration of an example structure resulting from execution of block 240. The via 114a may be formed in any of a variety of manners, non-limiting examples of which are provided herein. For example, block 240 may comprising forming the via 114a by, at least in part, forming a photoresist material on the reinforcement layer 114 and applying energy (e.g., light, etc.) to form a pattern, followed by performing a general photoresist process. The via 114a may then be formed to expose the land 113 by etching the reinforcement layer 114. Also for example, the via 114a may be performed by an ablation process (e.g., mechanical ablation, laser ablation, etc.). Exposing the land 113 through the reinforcement layer 114 may, for example, allow any of a variety of additional processes to be performed on the exposed land 113 (e.g., the coupling of an interconnection structure and/or additional conductive layers like under bump metallization layers to the land 113).

Figure 3H:
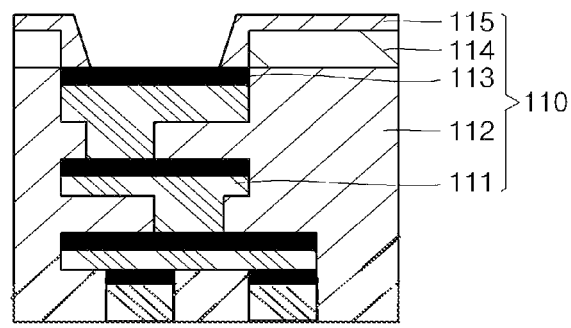

The example method 200 may, at block 245, comprise forming a dielectric layer 115 on the reinforcement layer 114 and/or around the via 114a. FIG. 3H provides an illustration of an example structure resulting from execution of block 245. For example, the dielectric layer 115 is formed to cover or surround the reinforcement layer 114. As shown in FIG. 3H, the dielectric layer 115 covers the entire surface of the reinforcement layer 114 on a side opposite the conductive layer(s) 111 and dielectric layer(s) 112, and also covers the surface(s) of the reinforcement layer 114 that define the via 114a (e.g., the walls of the via 114a). The dielectric layer 115 may also, for example as shown in FIG. 3H, cover an outer perimeter of the land 113, or an outer perimeter of an exposed portion of the land 113, thus leaving at least a center portion of the land 113 exposed through the reinforcement layer 114 and through the dielectric layer 115 Exposing the land 113 through the dielectric layer 115 and through the reinforcement layer 114 may, for example, allow any of a variety of additional processes to be performed on the exposed land 113 (e.g., formation of an under bump layer, the coupling of an interconnection structure to the land 113, etc.). Block 245 may comprise forming the dielectric layer 115 in any of a variety of manners, non-limiting examples of which are provided herein (e.g., chemical vapor deposition, etc.). Also, the dielectric layer 115 may also be formed using any of a variety of materials, many non-limiting examples of which are provided herein. For example, the dielectric layer 115 may comprise one of: polyimide (PI), benzocyclobutene (BCB), polybenzoxazole (PBO), bismaleimidetriazine (BT), phenolic resin, epoxy, silicon, silicon oxide (SiO2), silicon nitride (SI3N4), combinations thereof, equivalents thereof, etc. In an example implantation, the reinforcement layer 114 may comprise silicon, and the dielectric layer 115 may comprise an organic dielectric material.

Figure 3I:
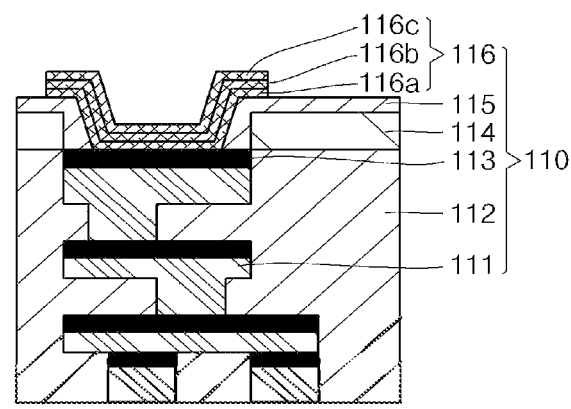

The example method 200 may, at block 250, comprise forming an under bump metal structure 116. FIG. 3I provides an illustration of an example structure resulting from execution of block 250. For example, block 250 may comprise forming the under bump metal structure 116 on the dielectric layer 115 and/or on the portion of the land 113 that is exposed from (e.g., in or through apertures in) the dielectric layer 115 and exposed from the reinforcement layer 114. As shown in FIG. 3I, the under bump metal structure 116 is formed on a top surface of the dielectric layer 115 and on sidewall portions of the dielectric layer 115 that define the opening that exposes the land 113.

Block 250 may comprise forming the under bump metal structure 116 in any of a variety of manners, non-limiting examples of which are provided herein. For example, block 250 may comprise forming one or more conductive layers of the under bump metal structure 116 using sputtering, electroplating, electroless plating, etc. The under bump metal structure 116 (or a layer thereof) may, for example, be formed directly on the land 113. The underbump metal 116 may, for example, be formed comprising one, two, three, or any number of conductive layers. The example illustrated in FIG. 3I shows three conductive layers 116a, 116b, and 116c in the under bump metal structure 116. The under bump metal structure 116 (or any layer thereof) may be made of any of a variety of materials, non-limiting examples of which are provided herein. For example, block 250 may comprise sequential layers of chrome/chrome-copper alloy/copper (Cr/Cr-Cu/Cu), titanium-tungsten alloy/copper (Ti—W/Cu), aluminum/nickel/copper (Al/Ni/Cu), combinations thereof, equivalents thereof, etc.

Figure 3J:
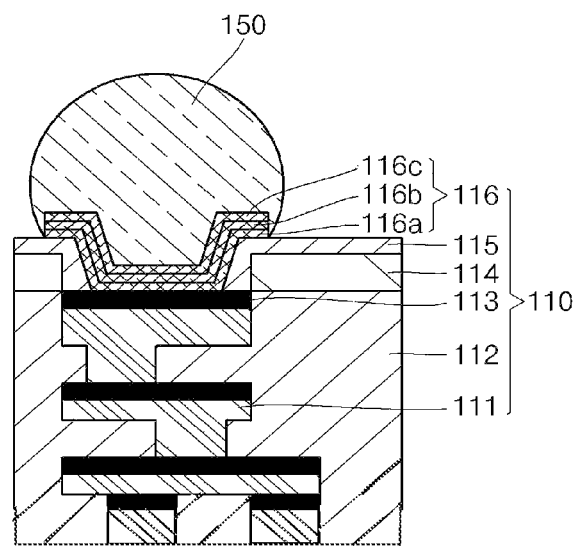

The example method 200 may, for example at block 255, comprise forming (e.g., building, attaching, etc.) a conductive interconnection structure 150 on the under bump metal structure 116. FIG. 3J provides an illustration of an example structure resulting from execution of block 255. The conductive interconnection structure 150 may comprise any of a variety of characteristics. For example, the conductive interconnection structure 150 may comprise a conductive ball (e.g., a solder ball, a copper core solder ball, etc.), a conductive bump (e.g., a C4 bump), a conductive pillar or post, a wire, a lead, etc. Block 255 may comprise forming the conductive interconnection structure 150 in any of a variety of manners, non-limiting examples of which are presented herein. For example, block 255 may comprise soldering or welding a preformed attachment structure (e.g., a preformed solder ball, etc.) to the under bump metal structure 116 or directly to the land 113. Also for example, block 255 may comprise building the attachment structure on the under bump metal structure 116 or directly on the land 113 (e.g., by plating, pasting, printing, etc.).

Referring to FIG. 3J, the conductive interconnection structure 150 (e.g., a solder ball) is reflowed to connect the interconnection structure 150 to the under bump metal structure 116, which in turn is connected to the land 113. The conductive interconnection structure 150 is thus electrically connected to the land 113 through the under bump metal structure 116, thereby forming a path for inputting/outputting signals to/from the conductive layers 111 of the interposer 110 to one or more electrical devices on the surface of the interposer 110 opposite the conductive interconnection structure 150.

Figure 3K:
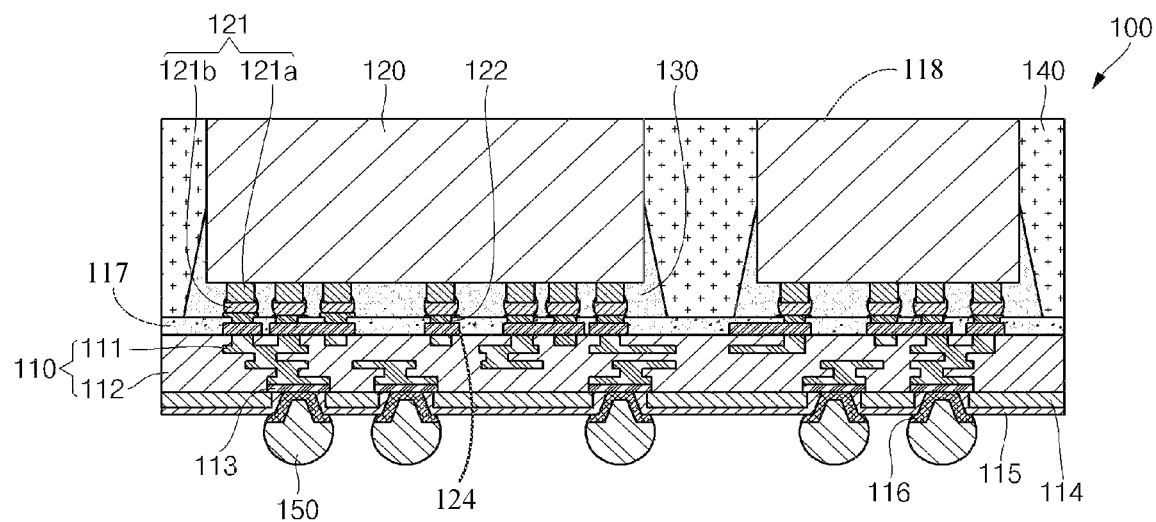

The example method 200, for example at block 260, may comprise mounting an electrical component (e.g., a semiconductor die 120, etc.) on the interposer 110. FIG. 3K shows an illustration of an example structure resulting from execution of block 260. Referring to FIG. 3K, the semiconductor die 120 (e.g., a connection terminal 121 thereof, as discussed herein) is coupled to a conductive layer 111 of the interposer 110 on a side of the interposer 110 opposite the conductive interconnection structure 150.

Note that explained with regard to FIG. 3D, the interposer 110 may be formed with any number of layers, an example of which is shown at item 117. Such additional layers 117 may, for example, be formed at the same time as the rest of the interposer (e.g., as shown at step 225 and FIGS. 3A-3D and the discussion thereof) or may be formed just prior to the mounting of the semiconductor die (e.g., after steps 250 and FIG. 3I, after step 255 and FIG. 3J, etc.). Such additional layers 117 may, for example, be formed utilizing the same materials and/or processes as discussed with regard to FIG. 3D and/or may be formed utilizing the same materials and/or processes as discussed with regard to FIGS. 3E-3J (e.g., with regard to layers 113, 114, 115, 116a, 116b, and/or 116c, or any combination thereof).

Also illustrated is a second electronic device adjacent to the semiconductor die 120 that is also coupled to a conductive layer 111 of the interposer 110 (e.g., to a connection pad 124). The semiconductor die 120 may, for example, be coupled to the conductive layer 111 in any of a variety of manners (e.g., soldered, epoxied, etc.). For example, as shown in FIG. 3K, the semiconductor die 120 may comprise a connection terminal 121 that comprises a copper pillar 121 with a solder cap 121b at its end. The connection terminal 121 may, for example, be soldered to a portion of the conductive layer 111 that is exposed through the dielectric layer 112 (e.g., to a connection pad 124) with solder 122.

Such soldering may, for example, be performed using mass reflow, thermocompression bonding, etc.

Block 260 may, for example, comprise forming an underfill 130 between the interposer 110 and the semiconductor die 120. The underfill 130 may, for example, surround a portion of the interposer 110 (e.g., a top surface thereof), a side portion of the semiconductor die 120, and/or surround interconnection structures (e.g., the connection terminals 121, solder 122, pads 124, etc.) of the semiconductor device 100. Block 260 may comprise forming the underfill 130 in any of a variety of manners (e.g., performing a capillary underfill processes, utilizing a pre-applied underfill that is applied before attaching the semiconductor die 120, underfilling with the encapsulant 140 discussed herein, etc.).

Block 260 may also, for example, comprise encapsulating various components of the semiconductor device 100 in an encapsulating material 140. For example, as is shown in FIG. 3K, the encapsulating material 140 may cover a portion of the interposer 110 (e.g., any of a variety of conductive and/or dielectric layers 111, 112, and 117), may cover side surfaces of the underfill 130, may cover side surfaces (or portions thereof) of the semiconductor die 120 and/or other electrical components, etc. Note that although the example semiconductor device 100 is shown in FIG. 3K with the top surface of the semiconductor die 120 exposed through the encapsulating material 140, the encapsulating material 140 may also cover the top surface of the die 120. The encapsulating material 140 may comprise any of a variety of different types of encapsulating materials (e.g., molding material, epoxy molding compound, resin, etc.). Block 260 may comprise performing the encapsulating in any of a variety of manners (e.g., compression molding, injection molding, flooding, etc.). Also, as mentioned herein, in various example implementations, the encapsulating material 140 may underfill between the semiconductor die 120 and the interposer 110 (e.g., instead of or in addition to the underfill 130).

The example semiconductor device 110 shown in FIG. 3K may, for example, share any or all characteristics with the example semiconductor device shown in FIG. 1 and discussed herein.

The operations illustrated in FIG. 3K may also, for example, be performed before the forming of the conductive interconnection structure 150 on the interposer 110. In some cases, the blocks illustrated in FIG. 3K may also be performed between the front surface treatment process (e.g., blocks 210 to 225) and the rear surface treatment processes (e.g., blocks 230-255) in the example manufacturing method 200 of the semiconductor device 100, for example before thinning the substrate 10.

Note that the order of operations shown in the example method 200 of FIG. 2 is merely an example. Accordingly, the scope of this disclosure should not be limited by such example order of operation. Also note that various blocks of the example method 200, or portions thereof, may be skipped without departing from the scope of this disclosure.

In summary, various aspects of this disclosure provide methods for manufacturing a semiconductor device and semiconductor devices produced thereby. For example and without limitation, various aspects of this disclosure provide methods for manufacturing a semiconductor device, and semiconductor devices produced thereby, that comprise forming an interposer (e.g., an interposer without TSVs, etc.) that comprises a reinforcement layer. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a substrate structure having a top side and a bottom side, the substrate structure comprising:
      a reinforcement layer comprising a top side, a bottom side, and an aperture that extends between the top and bottom sides of the reinforcement layer, where the reinforcement layer is a remnant of a thinned substrate, and wherein the reinforcement layer comprises a semiconductor and/or a glass material;
      a substrate dielectric layer comprising a top side and a bottom side, where the bottom side of the substrate dielectric layer is coupled to the top side of the reinforcement layer; and
      a substrate conductive layer comprising a top side and a bottom side, where the bottom side of the substrate conductive layer is coplanar with the bottom side of the substrate dielectric layer, and where at least a portion of the bottom side of the substrate conductive layer is exposed through the reinforcement layer by the aperture in the reinforcement layer;
   an interposer structure on the top side of the substrate structure, the interposer structure comprising:
      an interposer dielectric layer on the top side of the substrate dielectric layer; and
      an interposer conductive layer on the top side of the substrate conductive layer; and
   a signal distribution structure on the bottom side of the substrate structure, the signal distribution structure comprising an under bump metal structure that is coupled to the bottom side of the substrate conductive layer through the aperture in the reinforcement layer.

2. The electronic device of claim 1, wherein the reinforcement layer comprises a semiconductor material.

3. The electronic device of claim 1, wherein the bottom side of the substrate conductive layer comprises a seed layer.

4. The electronic device of claim 3, wherein the under bump metal structure directly contacts the seed layer.

5. The electronic device of claim 1, wherein the under bump metal structure directly contacts the bottom side of the substrate conductive layer.

6. An electric device comprising:
   a substrate structure having a top side and a bottom side, the substrate structure comprising:
      a reinforcement layer comprising a top side, a bottom side, and an aperture that extends between the top and bottom sides of the reinforcement layer, where the reinforcement layer is a remnant of a thinned substrate;
      a substrate dielectric layer comprising a top side and a bottom side, where the bottom side of the substrate dielectric layer is coupled to the top side of the reinforcement layer; and
      a substrate conductive layer comprising a top side a bottom side, where the bottom side of the substrate conductive layer is coplanar with the bottom side of the substrate dielectric layer, and where at least a portion of the bottom side of the substrate conductive layer is exposed through the reinforcement layer by the aperture in the reinforcement layer;

an interposer structure on the top side of the substrate structure, the interposer structure comprising:
an interposer dielectric layer on the top side of the substrate dielectric layer; and
an interposer conductive layer on the top side of the substrate conductive layer; and
a signal distribution structure on the bottom side of the substrate structure, the signal distribution structure comprising an under bump metal structure that is coupled to the bottom side of the substrate conductive layer through the aperture in the reinforcement layer,
wherein the bottom side of the reinforcement layer comprises a grinded surface.

7. The electronic device of claim 6, wherein the reinforcement layer has a thickness of less than or equal to 30 µm.

8. An electronic device comprising:
a substrate structure having a top side and a bottom side, the substrate structure comprising:
a reinforcement layer comprising a top side, a bottom side, and an aperture that extends between the top and bottom sides of the reinforcement layer, where the reinforcement layer is a remnant of a thinned substrate;
a substrate dielectric layer comprising a top side and a bottom side, where the bottom side of the substrate dielectric layer is coupled to the top side of the reinforcement layer; and
a substrate conductive layer comprising a top side and a bottom side, where the bottom side of the substrate conductive layer is coplanar with the bottom side of the substrate dielectric layer, and where at least a portion of the bottom side of the substrate conductive layer is exposed through the reinforcement layer by the aperture in the reinforcement layer;
an interposer structure on the top side of the substrate structure, the interposer structure comprising:
an interposer dielectric layer on the top side of the substrate dielectric layer; and
an interposer conductive layer on the top side of the substrate conductive layer; and
a signal distribution structure on the bottom side of the substrate structure, the signal distribution structure comprising an under bump metal structure that is coupled to the bottom side of the substrate conductive layer through the aperture in the reinforcement layer,
wherein the signal distribution structure (SDS) comprises an SDS dielectric layer that directly contacts and covers the bottom side of the reinforcement layer and that directly contacts and covers a lateral surface of the reinforcement layer inside the aperture.

9. The electronic device of claim 8, wherein the SDS dielectric layer directly contacts and covers only a perimeter portion of the bottom side of the substrate conductive layer.

10. The electronic device of claim 8, wherein the interposer dielectric layer and the SDS dielectric layer comprise a same dielectric material, and the reinforcement layer comprises a material different from said same dielectric material.

11. An electronic device comprising:
a substrate structure having a top side and a bottom side, the substrate structure comprising:
a reinforcement layer comprising a top side, a bottom side, and an aperture that extends between the top and bottom sides of the reinforcement layer;
a substrate dielectric layer comprising a top side and a bottom side, where the bottom side of the substrate dielectric layer is coupled to the top side of the reinforcement layer; and
a substrate conductive layer comprising a top side and a bottom side, wherein:
the bottom side of the substrate conductive layer comprises a substrate seed layer comprising a top side, and a bottom side that is coplanar with the bottom side of the substrate dielectric layer; and
at least a portion of the bottom side of the substrate seed layer is exposed through the reinforcement layer by the aperture in the reinforcement layer;
an interposer structure on the top side of the substrate structure, the interposer structure comprising:
an interposer dielectric layer on the top side of the substrate dielectric layer; and
an interposer conductive layer on the top side of the substrate conductive layer; and
a signal distribution structure on the bottom side of the substrate structure, the signal distribution structure comprising an under bump metal structure that is coupled to the bottom side of the substrate seed layer through the aperture in the reinforcement layer.

12. The electronic device of claim 11, wherein the reinforcement layer comprises a non-conductive material.

13. The electronic device of claim 11, wherein the under bump metal structure directly contacts the bottom side of the substrate seed layer.

14. The electronic device of claim 11, wherein the signal distribution structure comprises a metal layer that is plated on the bottom side of the substrate seed layer.

15. The electronic device of claim 11, wherein the signal distribution structure comprises a plurality of metal layers that extend into the aperture of the reinforcement layer.

16. The electronic device of claim 11, wherein the signal distribution structure (SDS) comprises an SDS dielectric layer that directly contacts and covers a portion of the bottom side of the substrate seed layer and that directly contacts and laterally surrounds at least a portion of the signal distribution structure.

17. An electronic device comprising:
a substrate structure having a top side and a bottom side, the substrate structure comprising:
a reinforcement layer comprising a top side, a bottom side, and an aperture that extends between the top and bottom sides of the reinforcement layer, where the reinforcement layer comprises a non-conductive material;
a substrate dielectric layer comprising a top side and a bottom side, where the bottom side of the substrate dielectric layer is directly coupled to the top side of the reinforcement layer; and
a substrate conductive layer comprising a top side and a bottom side, where the bottom side of the substrate conductive layer is coplanar with the bottom side of the substrate dielectric layer, and where at least a portion of the bottom side of the substrate conductive layer is exposed through the reinforcement layer by the aperture in the reinforcement layer;
an interposer structure on the top side of the substrate structure; and
a signal distribution structure (SDS) on the bottom side of the substrate structure, the signal distribution structure comprising:
an SDS dielectric layer directly on the bottom side of the reinforcement layer; and an under bump metal structure that is directly coupled to the bottom side of the substrate conductive layer through the aperture in the reinforcement layer, wherein the reinforcement layer laterally surrounds a portion of the SDS dielectric layer and does not laterally surround any of the substrate dielectric layer.

18. The electronic device of claim 17, wherein the non-conductive material of the reinforcement layer is a different type of material than the substrate dielectric layer and the SDS dielectric layer.

19. The electronic device of claim 17, wherein the non-conductive material of the reinforcement layer comprises a glass material.

20. An electronic device comprising:
a substrate structure having a top side and a bottom side, the substrate structure comprising:
  a reinforcement layer comprising a top side, a bottom side, and an aperture that extends between the top and bottom sides of the reinforcement layer, where the reinforcement layer comprises a non-conductive material;
  a substrate dielectric layer comprising a top side and a bottom side, where the bottom side of the substrate dielectric layer is directly coupled to the top side of the reinforcement layer; and
  a substrate conductive layer comprising a top side and a bottom side, where the bottom side of the substrate conductive layer is coplanar with the bottom side of the substrate dielectric layer, and where at least a portion of the bottom side of the substrate conductive layer is exposed through the reinforcement layer by the aperture in the reinforcement layer;
an interposer structure on the top side of the substrate structure; and
a signal distribution structure (SDS) on the bottom side of the substrate structure, the signal distribution structure comprising:
  an SDS dielectric layer directly on the bottom side of the reinforcement layer; and
  an under bump metal structure that is directly coupled to the bottom side of the substrate conductive layer through the aperture in the reinforcement layer,
wherein:
  the non-conductive material of the reinforcement layer is a different type of material than the substrate dielectric layer and the SDS dielectric layer; and
  the non-conductive material of the reinforcement layer comprises a semiconductor material and/or a glass material.

* * * * *